(12) United States Patent
Ogawa

(10) Patent No.: US 12,277,897 B2
(45) Date of Patent: Apr. 15, 2025

(54) DISPLAY DEVICE

(71) Applicant: Japan Display Inc., Tokyo (JP)

(72) Inventor: Akihiro Ogawa, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 18/442,816

(22) Filed: Feb. 15, 2024

(65) Prior Publication Data

US 2024/0194124 A1 Jun. 13, 2024

Related U.S. Application Data

(63) Continuation of application No. PCT/JP2022/029622, filed on Aug. 2, 2022.

(30) Foreign Application Priority Data

Sep. 30, 2021 (JP) ................................ 2021-160405

(51) Int. Cl.
*G09G 3/20* (2006.01)
*G09G 3/32* (2016.01)

(52) U.S. Cl.
CPC ............. *G09G 3/32* (2013.01); *G09G 3/2081* (2013.01); *G09G 2310/08* (2013.01); *G09G 2320/043* (2013.01)

(58) Field of Classification Search
CPC .......... G09G 3/20; G09G 3/32; G09G 3/3233; G09G 3/2081; G09G 2310/08;
(Continued)

(56) References Cited

U.S. PATENT DOCUMENTS

2003/0214465 A1* 11/2003 Kimura ................ G09G 3/3241
345/76
2005/0243079 A1* 11/2005 Ozaki .................. G09G 3/2022
345/204
(Continued)

FOREIGN PATENT DOCUMENTS

JP 2005-338811 A 12/2005
JP 2006-126874 A 5/2006
(Continued)

OTHER PUBLICATIONS

Search Report issued in International Patent Application No. PCT/JP2022/029622, mailed Oct. 25, 2022 and English translation of same. 8 pages.

(Continued)

*Primary Examiner* — Ryan A Lubit
(74) *Attorney, Agent, or Firm* — K&L Gates LLP

(57) ABSTRACT

A display device includes a plurality of light-emitting elements arrayed in a display region, a first pixel circuit and a second pixel circuit coupled to each of the light-emitting elements, a first drive transistor provided to the first pixel circuit and configured to supply a first drive current to the light-emitting element, a second drive transistor provided to the second pixel circuit and configured to supply a second drive current to the light-emitting element, a drive circuit configured to supply a video signal to the first drive transistor and the second drive transistor, a first coupling switching transistor provided between the first drive transistor and the light-emitting element, and a second coupling switching transistor provided between the second drive transistor and the light-emitting element. The first coupling switching transistor and the second coupling switching transistor are turned off in a non-emission period of the light-emitting element.

10 Claims, 9 Drawing Sheets

(58) Field of Classification Search
CPC ... G09G 2320/043; H01L 33/00; H01L 33/62; H05B 33/02
See application file for complete search history.

(56) References Cited

U.S. PATENT DOCUMENTS

| | | | |
|---|---|---|---|
| 2006/0125741 A1* | 6/2006 | Tanaka | G09G 3/3233 345/79 |
| 2010/0141616 A1 | 6/2010 | Tanaka et al. | |
| 2013/0300639 A1* | 11/2013 | Kim | G09G 3/3233 257/89 |
| 2018/0350286 A1 | 12/2018 | Lee et al. | |
| 2020/0035156 A1* | 1/2020 | Yanase | G09G 3/3233 |
| 2021/0312856 A1* | 10/2021 | Jeong | G09G 3/32 |
| 2021/0390902 A1* | 12/2021 | Lee | G09G 3/32 |
| 2022/0198995 A1* | 6/2022 | Ahmed | H01L 29/7869 |
| 2023/0099833 A1 | 3/2023 | Suzuki | |

FOREIGN PATENT DOCUMENTS

| | | |
|---|---|---|
| JP | 2006-163045 A | 6/2006 |
| JP | 2008-287195 A | 11/2008 |
| JP | 2010-276783 A | 12/2010 |
| JP | 2016-109772 A | 6/2016 |
| JP | 2018-205707 A | 12/2018 |
| JP | 2020-024373 A | 2/2020 |
| JP | 2020-064159 A | 4/2020 |
| WO | WO2021/171921 A1 | 9/2021 |

OTHER PUBLICATIONS

Written Opinion issued in International Patent Application No. PCT/JP2022/029622, mailed Oct. 25, 2022. 5 pages.

Office Action issued in related Japanese Patent Application No. 2023-550420, mailed on Sep. 17, 2024 and English translation of same. 10 pages.

* cited by examiner

DISPLAY DEVICE

CROSS-REFERENCE TO RELATED APPLICATION

This application is a continuation of International Patent Application No. PCT/JP2022/029622 filed on Aug. 2, 2022 which designates the United States, incorporated herein by reference, and which claims the benefit of priority from Japanese Patent Application No. 2021-160405 filed on Sep. 30, 2021, incorporated herein by reference.

BACKGROUND

1. Technical Field

The present disclosure relates to a display device.

2. Description of the Related Art

Widely known are display devices with light-emitting elements, such as inorganic light-emitting diodes (micro LEDs) and organic light-emitting diodes (OLEDs). Japanese Patent Application Laid-open Publication No. 2020-64159 (JP-A-2020-64159) describes a gradation control method for display combining a current drive system that expresses gradation by adjusting the current value and a pulse width modulation system that expresses gradation by controlling the lighting time as a drive system for expressing gradation of light-emitting elements.

The current drive system depends on the performance of transistors that adjust the current value, and the light emission intensity may differ from the desired light emission intensity depending on the characteristics of the transistors that adjust the current value. By contrast, the pulse width modulation system needs to switch on and off switching elements of pixel circuits according to the lighting time and requires a drive time to rise to the desired current value. As a result, it is difficult to perform a high-speed pixel writing operation. Therefore, it may possibly be difficult to control fine gradation expression. JP-A-2020-64159 does not describe any specific circuit configuration to implement the current drive system and the pulse width modulation system.

SUMMARY

A display device according to an embodiment of the present disclosure includes a plurality of light-emitting elements arrayed in a display region, a first pixel circuit and a second pixel circuit coupled to each of the light-emitting elements, a first drive transistor provided to the first pixel circuit and configured to supply a first drive current to the light-emitting element, a second drive transistor provided to the second pixel circuit and configured to supply a second drive current to the light-emitting element, a drive circuit configured to supply a video signal to the first drive transistor and the second drive transistor, a first coupling switching transistor provided between the first drive transistor and the light-emitting element, and a second coupling switching transistor provided between the second drive transistor and the light-emitting element. The first coupling switching transistor and the second coupling switching transistor are turned off in a non-emission period of the light-emitting element.

DETAILED DESCRIPTION

Figure 1:
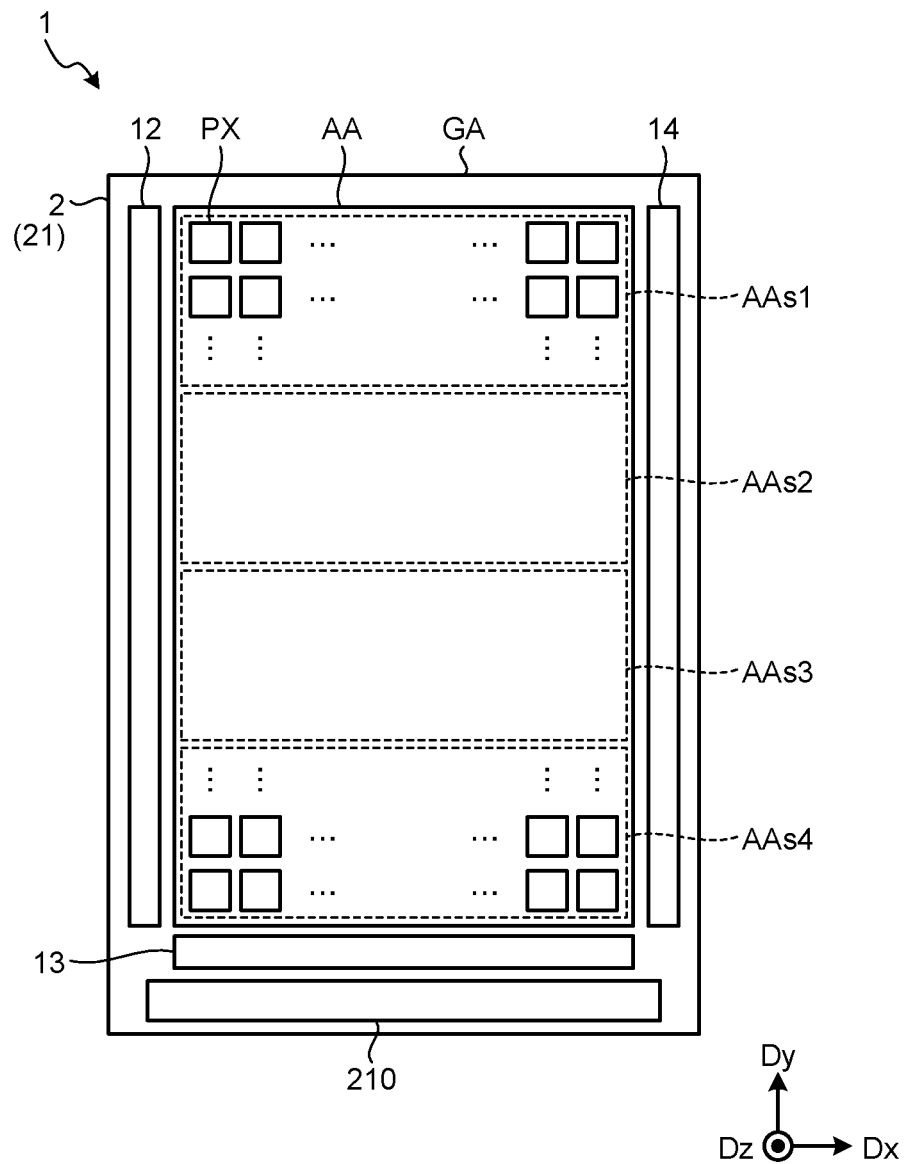
FIG. 1 is a plan view of a display device according to an embodiment.

Exemplary aspects (embodiments) to embody the present disclosure are described below in greater detail with reference to the accompanying drawings. The contents described in the embodiments below are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may illustrate the width, the thickness, the shape, and other elements of each unit more schematically than an actual aspect. These elements, however, are given by way of example only and are not intended to limit interpretation of the present disclosure. In the present disclosure and the drawings, components similar to those previously described with reference to previous drawings are denoted by like reference numerals, and detailed explanation thereof may be appropriately omitted.

To describe an aspect where a first structure is disposed on a second structure in the present specification and the claims, the term "on" includes both of the following cases unless otherwise noted: a case where the first structure is disposed directly on the second structure in contact with the second structure, and a case where the first structure is disposed on the second structure with another structure interposed therebetween.

EMBODIMENTS

FIG. 1 is a plan view of a display device according to an embodiment. A display device 1 according to the present embodiment is a micro LED display device with micro LEDs. As illustrated in FIG. 1, the display device 1 includes an array substrate 2, a plurality of pixels PX, a scanning line drive circuit 12, a signal line drive circuit 13, a light emission control circuit 14, and a drive integrated circuit (IC) 210.

The array substrate 2 is a drive circuit substrate for driving the pixels PX and is also called a backplane or an active matrix substrate. The array substrate 2 is formed using a substrate 21 as a base and includes a plurality of transistors, a plurality of capacitances, various kinds of wiring, and other components on the substrate 21. A wiring substrate (e.g., flexible printed circuits (FPC)) or the like, which is not specifically illustrated, may be coupled onto the array substrate 2 to receive various control signals and electric power from an external control substrate.

In the following description, a first direction Dx is one direction in a plane parallel to the substrate 21. A second direction Dy is one direction in the plane parallel to the substrate 21 and is orthogonal to the first direction Dx. The second direction Dy may intersect the first direction Dx without being orthogonal thereto. A third direction Dz is a direction orthogonal to the first direction Dx and the second direction Dy and normal to the substrate 21. The term "plan view" indicates the positional relation viewed from the third direction Dz.

The scanning line drive circuit 12 is a circuit that drives a plurality of scanning lines (e.g., a reset control signal line L5, a writing control scanning line L7, and an initialization control signal line L8 (refer to FIG. 4)) based on various control signals supplied from the drive IC 210. The scanning line drive circuit 12 sequentially or simultaneously selects a plurality of gate lines and supplies gate drive signals to the selected scanning lines. As a result, the scanning line drive circuit 12 selects a plurality of pixels PX coupled to the gate lines.

The signal line drive circuit 13 is a drive circuit that supplies potentials (a video signal VSG, a reset power supply potential Vrst, and an initialization potential Vini) to signal lines (a video signal line L2, a reset power supply line L3, and an initialization power supply line L4 (refer to FIG. 4)) in a display region AA to drive a plurality of pixels PX. The light emission control circuit 14 is a drive circuit that supplies signals to scanning lines (a light emission control scanning line L6 and a coupling control scanning line L9 (refer to FIG. 4)) in the display region AA to drive a plurality of pixels PX. The drive IC 210 is a circuit that supplies control signals to the scanning line drive circuit 12, the signal line drive circuit 13, and the light emission control circuit 14 to control display on a plurality of pixels PX. At least part of the scanning line drive circuit 12, the signal line drive circuit 13, and the light emission control circuit 14 may be formed integrally with the drive IC 210. The drive IC 210 is provided on the array substrate 2. The configuration is not limited thereto, and the drive IC 210 may be provided to a wiring substrate coupled to the array substrate 2.

The array substrate 2 has the display region AA and a peripheral region GA. The display region AA is provided with a plurality of pixels PX. The pixels PX are arrayed in a matrix (row-column configuration) in the display region AA. The peripheral region GA is a region positioned outside the display region AA and not provided with the pixels PX. The peripheral region GA is provided with the scanning line drive circuit 12, the signal line drive circuit 13, the light emission control circuit 14, and the drive IC 210. The scanning line drive circuit 12 and the light emission control circuit 14 are provided in regions extending along the second direction Dy in the peripheral region GA. The signal line drive circuit 13 and the drive IC 210 are provided in a region extending along the first direction Dx in the peripheral region GA. The scanning line drive circuit 12 and the light emission control circuit 14 may be provided in a region along the same side of the peripheral region GA.

In the following explanation, the display region AA is divided into four parts, and the display device 1 performs a display operation on each of a first partial display region AAs1, a second partial display region AAs2, a third partial display region AAs3, and a fourth partial display region AAs4 (refer to FIG. 5).

To simplify the explanation, the display region AA according to the present embodiment has a rectangular shape, and the peripheral region GA has a rectangular frame shape surrounding the display region AA. The configuration is not limited thereto, and the display region AA may have a polygonal shape or an irregular shape with cutouts (notches) or curved portions in part of the outer periphery. The peripheral region GA may have various shapes depending on the shape of the display region AA.

Figure 2:
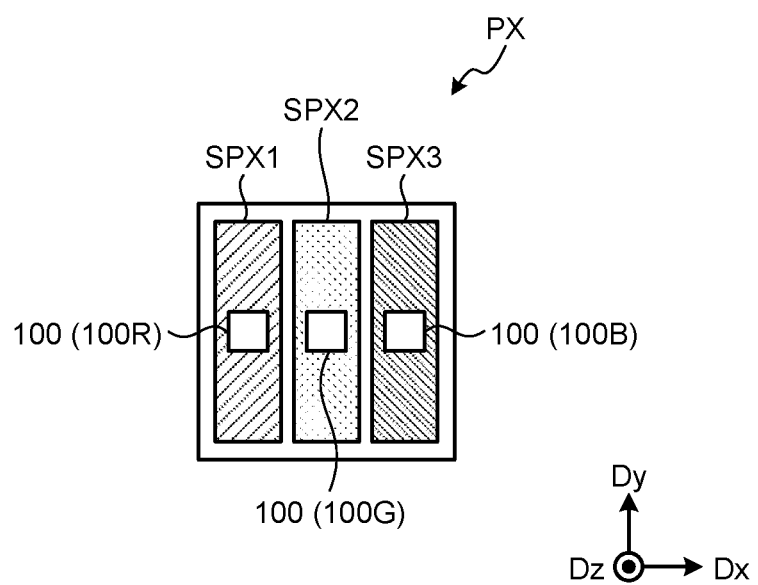
FIG. 2 is a plan view of an example of a pixel of the display device according to the embodiment.

FIG. 2 is a plan view of an example of the pixel of the display device according to the embodiment. As illustrated in FIG. 2, the pixel PX includes a first sub-pixel SPX1, a second sub-pixel SPX2, and a third sub-pixel SPX3. The first sub-pixel SPX1, the second sub-pixel SPX2, and the third sub-pixel SPX3 each include a light-emitting element 100. The light-emitting element 100 is an inorganic light-emitting diode (LED) chip having a size of approximately 3 µm to 300 µm in plan view and is called a micro LED. The term "micro" of the micro LED is not intended to limit the size of the light-emitting element 100. In the following description, the first sub-pixel SPX1, the second sub-pixel SPX2, and the third sub-pixel SPX3 are referred to simply as sub-pixels SPX when they need not be distinguished from one another. While the light-emitting element 100 is disposed at the center in each sub-pixel SPX, FIG. 2 is given by way of schematic example only, and the position of the light-emitting element 100 can be appropriately changed in each sub-pixel SPX.

The first sub-pixel SPX1 displays red (R), for example. The second sub-pixel SPX2 displays green (G), for example. The third sub-pixel SPX3 displays blue (B), for example. The first sub-pixel SPX1, the second sub-pixel SPX2, and the third sub-pixel SPX3 are adjacently disposed in the first direction Dx. The configuration is not limited thereto, and the pixels PX may be in other arrangements. For example, the first sub-pixel SPX1 and the second sub-pixel SPX2 may be disposed side by side in the second direction Dy, and one third sub-pixel SPX3 may be disposed side by side in the first direction Dx with the first sub-pixel SPX1 and the second sub-pixel SPX2 disposed side by side in the second direction Dy. The pixel PX may be configured in what is called the PenTile array. The pixel PX is not necessarily composed of three sub-pixels SPX and may be composed of four or more sub-pixels SPX.

Figure 3:
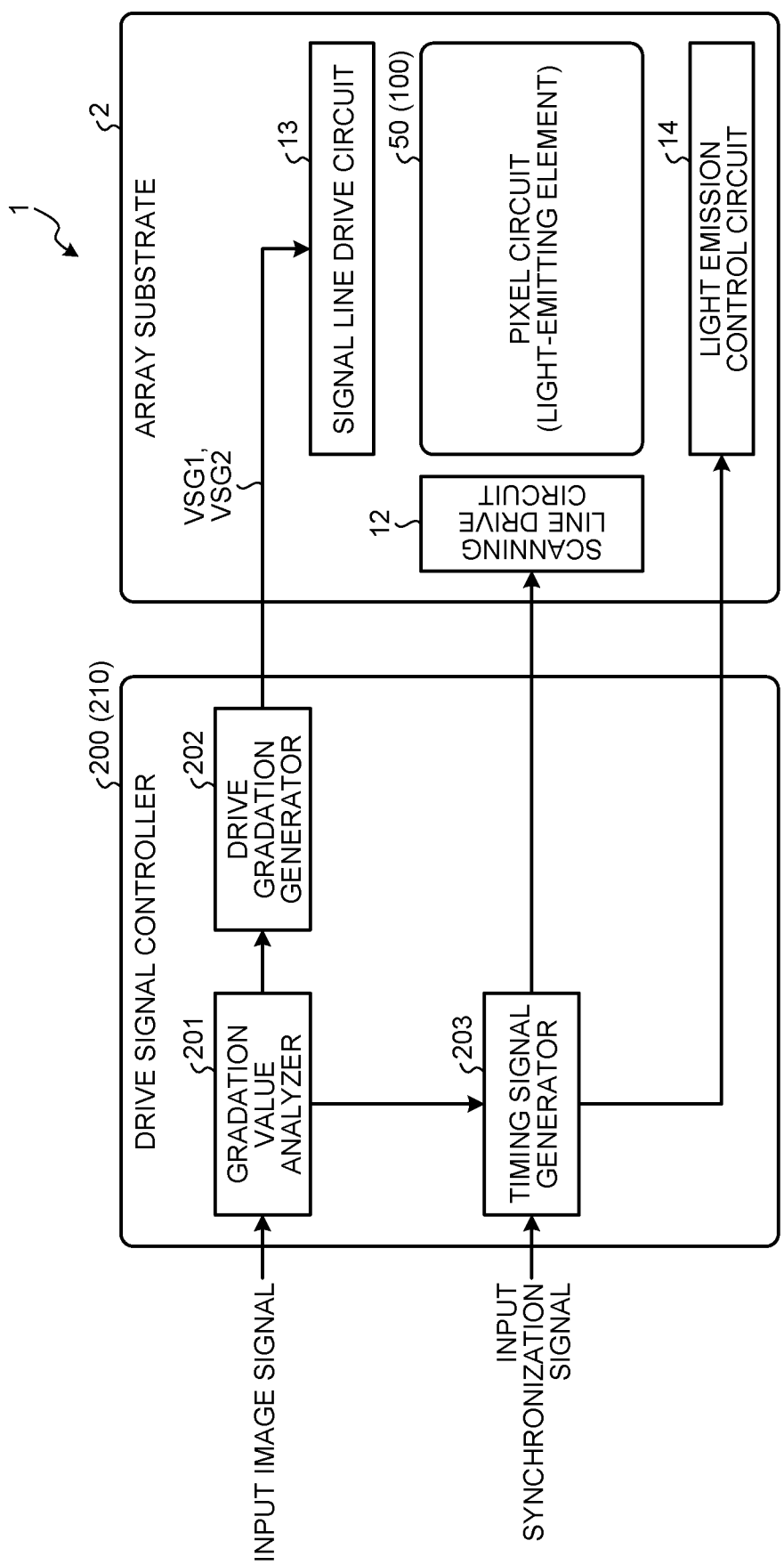
FIG. 3 is a block diagram of an exemplary configuration of the display device according to the embodiment.

Next, gradation control performed by the display device 1 is described. FIG. 3 is a block diagram of an exemplary configuration of the display device according to the embodiment. As illustrated in FIG. 3, the display device 1 includes a pixel circuit 50 and a drive signal controller 200 that controls the driving of the pixel circuit 50. The pixel circuit 50 is a circuit that supplies drive signals (current) to the light-emitting element 100 to drive the light-emitting element 100. While one pixel circuit 50 (light-emitting element 100) is schematically illustrated in FIG. 3, a plurality of pixel circuits 50 and a plurality of light-emitting elements 100 are provided to the respective sub-pixels SPX (refer to FIG. 2) and arrayed in a matrix (row-column configuration) in the display region AA.

The drive signal controller 200 includes a gradation value analyzer 201, a drive gradation generator 202, and a timing signal generator 203. The gradation value analyzer 201 is a circuit that calculates a gradation value (hereinafter, which may be referred to as target luminance level) for each pixel PX (sub-pixel SPX) based on image signals received from an external control circuit.

The drive gradation generator 202 is a circuit that generates a first video signal VSG1 and a second video signal VSG2 based on the target luminance level received from the gradation value analyzer 201. The signal line drive circuit 13 of the array substrate 2 outputs the first video signal VSG1 and the second video signal VSG2 supplied from the drive gradation generator 202 to the pixel circuit 50 to drive the pixels PX at the target luminance level. In the following explanation, the first video signal VSG1 and the second video signal VSG2 may be referred to simply as video signals VSG when they need not be distinguished from each other.

The timing signal generator 203 generates timing signals based on synchronization signals received from the external control circuit and the target luminance level received from the gradation value analyzer 201. The scanning line drive circuit 12 and the light emission control circuit 14 output control signals (e.g., a writing control signal SG and a light emission control signal BG) to the pixel circuit 50 based on timing signals (control signals) supplied from the timing signal generator 203.

The first video signal VSG1 and the second video signal VSG2 have a predetermined signal potential to turn on the light-emitting element 100. The timing signal (control signal) supplied from the timing signal generator 203 includes information on the lighting period of the light-emitting element 100 by the light emission control circuit 14. The display device 1 can perform multi-gradation display by combining a system that expresses gradation by controlling the current value supplied to the light-emitting element 100 of each sub-pixel SPX (hereinafter referred to as a current drive system or an analog drive system) and a system that expresses gradation by controlling the lighting time of the light-emitting element 100 while making the current value supplied to the light-emitting element 100 constant (hereinafter referred to as a PWM drive system or a pulse width modulation system). The drive signal controller 200 may be formed integrally with the drive IC 210 or may be provided to the external control circuit.

Figure 4:
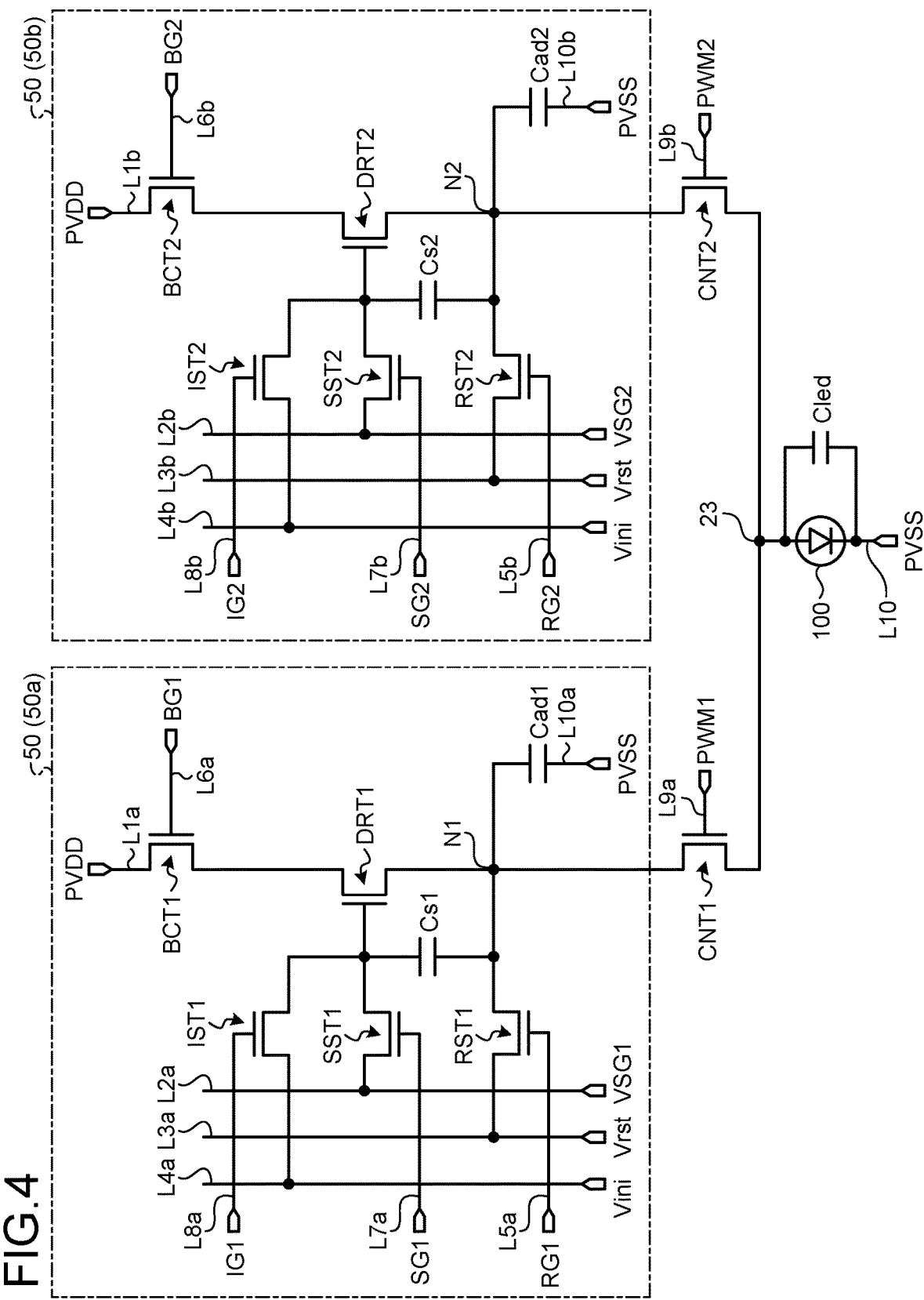
FIG. 4 is a circuit diagram of an exemplary configuration of a pixel circuit.

FIG. 4 is a circuit diagram of an exemplary configuration of the pixel circuit. As illustrated in FIG. 4, the pixel circuit 50 includes a first pixel circuit 50a and a second pixel circuit 50b. The first pixel circuit 50a and the second pixel circuit 50b are coupled to one light-emitting element 100. In other words, the first pixel circuit 50a and the second pixel circuit 50b are provided to each of the sub-pixels SPX. The first pixel circuit 50a is a circuit that drives the light-emitting element 100 by the current drive system. The first pixel circuit 50a can also be used as a circuit that drives the light-emitting element 100 by the PWM drive system in part of a frame period for displaying one screen. The second pixel circuit 50b is a circuit that drives the light-emitting element 100 by the PWM drive system.

The first pixel circuit 50a includes a first light emission control transistor BCT1, a first writing transistor SST1, a first drive transistor DRT1, a first initialization transistor IST1, a first reset transistor RST1, and a first coupling switching transistor CNT1. The thin-film transistors included in the first pixel circuit 50a are each composed of an n-type thin-film transistor (TFT). The first pixel circuit 50a also includes a first holding capacitance Cs1 and a first additional capacitance Cad1.

The gate of the first light emission control transistor BCT1 is coupled to a first light emission control scanning line L6a. The first light emission control scanning line L6a is supplied with a first light emission control signal BG1. One of the source and the drain of the first light emission control transistor BCT1 is coupled to a first anode power supply line L1a and is supplied with a power supply voltage PVDD from the first anode power supply line L1a. The other of the source and the drain of the first light emission control transistor BCT1 is coupled to the first drive transistor DRT1. When the first light emission control transistor BCT1 is turned on (electrically coupled state), the power supply voltage PVDD is supplied to the first drive transistor DRT1.

The gate of the first writing transistor SST1 is coupled to a first writing control scanning line L7a. The first writing control scanning line L7a is supplied with a first writing control signal SG1. One of the source and the drain of the first writing transistor SST1 is coupled to a first video signal line L2a. The other of the source and the drain of the first writing transistor SST1 is coupled to the gate of the first drive transistor DRT1. When the first writing transistor SST1 is turned on (electrically coupled state), the first video signal VSG1 is supplied from the signal line drive circuit 13 to the gate of the first drive transistor DRT1.

The ON state of the drive transistor DRT varies depending on the magnitude of the first video signal VSG1. If the first video signal VSG1 has a signal potential corresponding to the maximum luminance of the light-emitting element 100, for example, the drive transistor DRT is substantially completely turned on due to the potential of the first video signal VSG1. As a result, the current (predetermined fixed potential) from the power supply voltage PVDD passes through the drive transistor DRT substantially without any change and is supplied to the light-emitting element 100. By contrast, if the first video signal VSG1 has a signal potential corresponding to the lowest luminance of the light-emitting element 100, that is, black, the drive transistor DRT is turned off, and the current from the supply voltage PVDD is not supplied to the light-emitting element 100.

Thus, the ON state of the drive transistor DRT changes by the magnitude corresponding to the signal potential of the first video signal VSG1. As a result, only part of the current from the power supply voltage PVDD is supplied to the light-emitting element 100 in proportion to the ON state of the drive transistor DRT.

The gate of the first initialization transistor IST1 is coupled to a first initialization control signal line L8a. The first initialization control signal line L8a is supplied with a first initialization control signal IG1. One of the source and the drain of the first initialization transistor IST1 is coupled to a first initialization power supply line L4a. The other of the source and the drain of the first initialization transistor IST1 is coupled to the gate of the first drive transistor DRT1 and the other of the source and the drain of the first writing transistor SST1. The first initialization power supply line L4a is supplied with an initialization potential Vini. In other words, when the first initialization transistor IST1 is turned on (electrically coupled state), the gate of the drive transistor DRT is supplied with the first initialization potential Vini via the first initialization transistor IST1.

The gate of the first reset transistor RST1 is coupled to a first reset control signal line L5a. The first reset control signal line L5a is supplied with a first reset control signal RG1. One of the source and the drain of the first reset transistor RST1 is coupled to a first reset power supply line L3a. The other of the source and the drain of the first reset transistor RST1 is coupled to the source (node N1 on the output side) of the first drive transistor DRT1. The first reset power supply line L3a is supplied with the reset power supply potential Vrst. In other words, when the first reset transistor RST1 is turned on (electrically coupled state), the source (node N1 on the output side) of the drive transistor DRT is supplied with the reset power supply potential Vrst via the first reset transistor RST1.

The gate of the first coupling switching transistor CNT1 is coupled to a first coupling control scanning line L9a. The first coupling control scanning line L9a is supplied with a first coupling control signal PWM1. One of the source and the drain of the first coupling switching transistor CNT1 is coupled to the source (node N1 on the output side) of the first drive transistor DRT1 via the node N1 on the output side. The other of the source and the drain of the first coupling switching transistor CNT1 is coupled to an anode 23 of the light-emitting element 100. In other words, the first coupling switching transistor CNT1 is coupled between the first drive transistor DRT1 and the light-emitting element 100.

The cathode of the light-emitting element 100 is supplied with a power supply voltage PVSS via a cathode power supply line L10. The light-emitting element 100 ideally emits light by being supplied with a forward current (drive current) due to the potential difference (PVDD-PVSS) between the power supply voltage PVDD supplied to the anode and the power supply voltage PVSS supplied to the cathode.

The first writing control scanning line La, the first initialization control signal line L8a, and the first reset control signal line L5a are coupled to the scanning line drive circuit 12 illustrated in FIG. 3. The scanning line drive circuit 12 supplies various control signals to the first writing control scanning line La, the first initialization control signal line L8a, and the first reset control signal line L5a. The first light emission control scanning line L6a and the first coupling control scanning line L9a are coupled to the light emission control circuit 14. The light emission control circuit 14 supplies control signals to the first light emission control scanning line L6a and the first coupling control scanning line L9a.

The first holding capacitance Cs1 included in the first pixel circuit 50a is a capacitance formed between the gate and the source (node N1 on the output side) of the first drive transistor DRT1. The first additional capacitance Cad1 is a capacitance formed between the node N1 on the output side and the first cathode power supply line L10a.

The second pixel circuit 50b includes a second light emission control transistor BCT2, a second writing transistor SST2, a second drive transistor DRT2, a second initialization transistor IST2, a second reset transistor RST2 and a second coupling switching transistor CNT2. The second pixel circuit 50b includes a second anode power supply line L1b, a second video signal line L2b, a second reset power supply line L3b, a second initialization power supply line L4b, a second reset control signal line L5b, a second light emission control scanning line L6b, a second writing control scanning line L7b, a second initialization control signal line L8b, a second coupling control scanning line L9b, a second cathode power supply line L10b. The second pixel circuit 50b has a configuration similar to that of the first pixel circuit 50a, and repeated explanation thereof is omitted. In the second pixel circuit 50b, when the second light emission control transistor BCT2 is turned on (electrically coupled state), the power supply voltage PVDD is supplied to the second drive transistor DRT2.

The gate of the second coupling switching transistor CNT2 is coupled to the second coupling control scanning line L9b. The second coupling control scanning line L9b is supplied with a second coupling control signal PWM2. One of the source and the drain of the second coupling switching transistor CNT2 is coupled to the second drive transistor DRT2. The other of the source and the drain of the second coupling switching transistor CNT2 is coupled to the anode 23 of the light-emitting element 100. In other words, the second coupling switching transistor CNT2 is coupled between the second drive transistor DRT2 and the light-emitting element 100.

The second pixel circuit 50b also includes a second holding capacitance Cs2 and a second additional capacitance Cad2. The second holding capacitance Cs2 is a capacitance formed between the gate and the source (node N2 on the output side) of the second drive transistor DRT2. The second additional capacitance Cad2 is a capacitance formed between the node N2 on the output side and the second cathode power supply line L10b.

To facilitate the reader's understanding, FIG. 4 separately illustrates the wiring (the first anode power supply line L1a to the first cathode power supply line L10a) included in the first pixel circuit 50a and the wiring (the second anode power supply line L1b to the second cathode power supply line L10b) included in the second pixel circuit 50b. However, as will be described later with reference to FIG. 9, the first pixel circuit 50a and the second pixel circuit 50b may share part of the wiring.

In the following description, the thin-film transistors of the first pixel circuit 50a and the thin-film transistors of the second pixel circuit 50b may be referred to simply as the light emission control transistor BCT, the writing transistor SST, the drive transistor DRT, the initialization transistor IST, the reset transistor RST, and the coupling switching transistor CNT when they need not be distinguished from each other.

The wiring of the first pixel circuit 50a and the wiring of the second pixel circuit 50b may be referred to simply as the anode power supply line L1, the video signal line L2, the reset power supply line L3, the initialization power supply line L4, the reset control signal line L5, the light emission control scanning line L6, the writing control scanning line L7, the initialization control signal line L8, the coupling control scanning line L9, and the cathode power supply line L10 when they need not be distinguished from each other.

The control signals supplied to the first pixel circuit 50a and the control signals supplied to the second pixel circuit 50b may be referred to simply as the light emission control signal BG, the writing control signal SG, the initialization control signal IG, the reset control signal RG, and the coupling control signal PWM when they need not be distinguished from each other.

Figure 5:
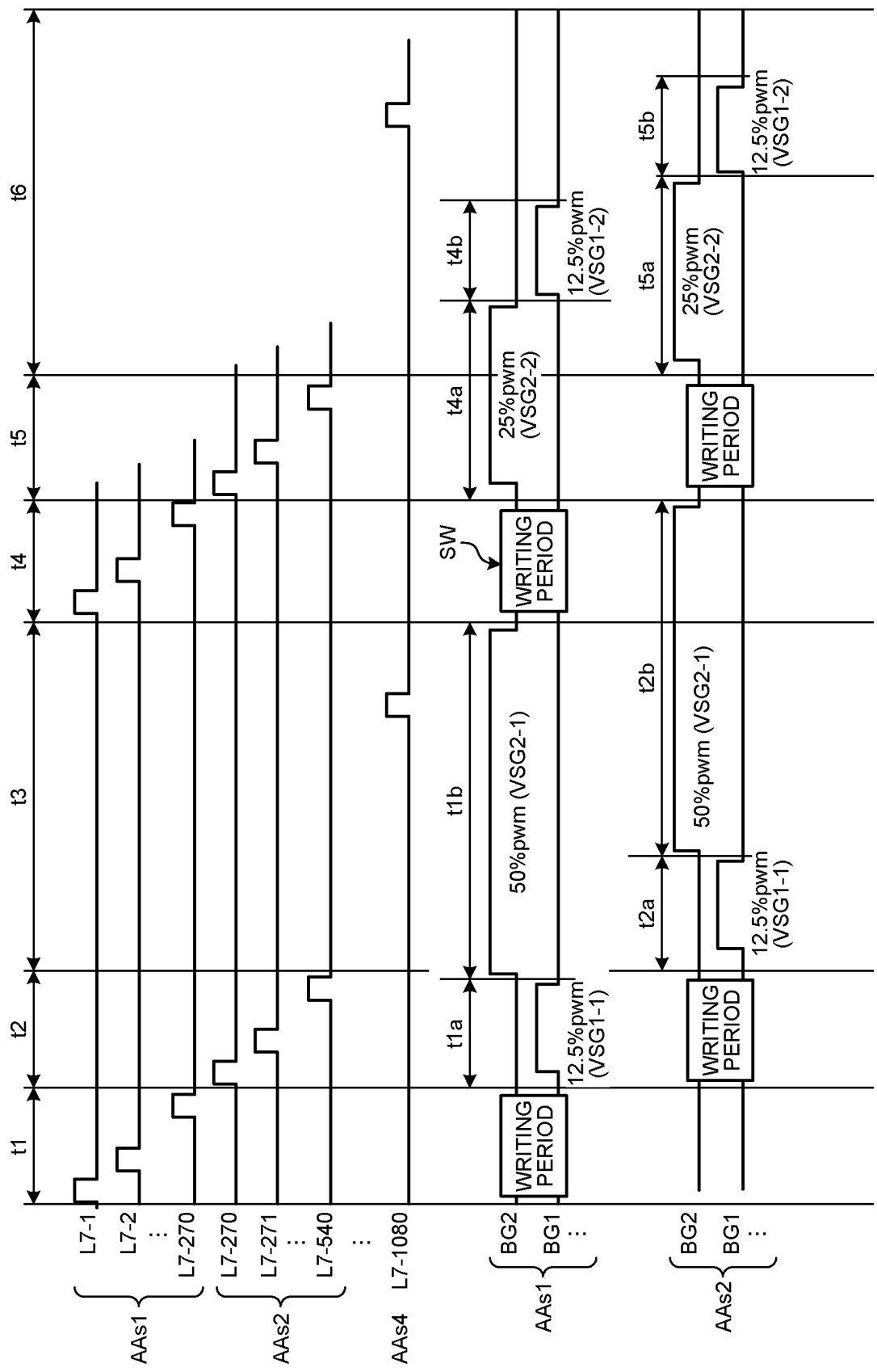
FIG. 5 is a timing chart for explaining an example of operations performed by the display device according to the embodiment.

FIG. 5 is a timing chart for explaining an example of operations performed by the display device according to the embodiment. While FIG. 5 illustrates the operations of driving the sub-pixels SPX in the first partial display region AAs1 and the second partial display region AAs2, the sub-pixels SPX are continuously driven from the third partial display region AAs3 to the sub-pixel SPX in the last row. In the following description, the period for driving the sub-pixels SPX from the first row to the last row is referred to as a frame period.

As illustrated in FIG. 5, a period t1 is a video signal writing operation period for the first partial display region AAs1. Specifically, in the period t1, the potentials (the first light-emitting control signal BG1 and the second light-emitting control signal BG2) of the first light emission control scanning line La and the second light emission control scanning line L6*b* are at the L level, and the potentials (the first writing control signal SG1 and the second writing control signal SG2) of writing control scanning lines L7-1, L7-2, ..., and L7-270 are at the H level by the control signals supplied from the scanning line drive circuit 12 and the light emitting control circuit 14.

In the period t1, the first light emission control transistor BCT1 of the first pixel circuit 50*a* and the second light emission control transistor BCT2 of the second pixel circuit 50*b* are turned off. The first writing transistor SST1 of the first pixel circuit 50*a* and the second writing transistor SST2 of the second pixel circuit 50*b* are turned on. In the period t1, the writing control scanning lines L7 belonging to the first partial display region AAs1 are sequentially scanned. The writing control scanning line L7-1 is the writing control scanning line L7 coupled to the sub-pixels SPX in the first row, and the writing control scanning line L7-2 is the writing control scanning line L7 coupled to the sub-pixels SPX in the second row. The first partial display region AAs1 is a region including the writing control scanning lines L7-1 to L7-270, for example.

Figure 6:
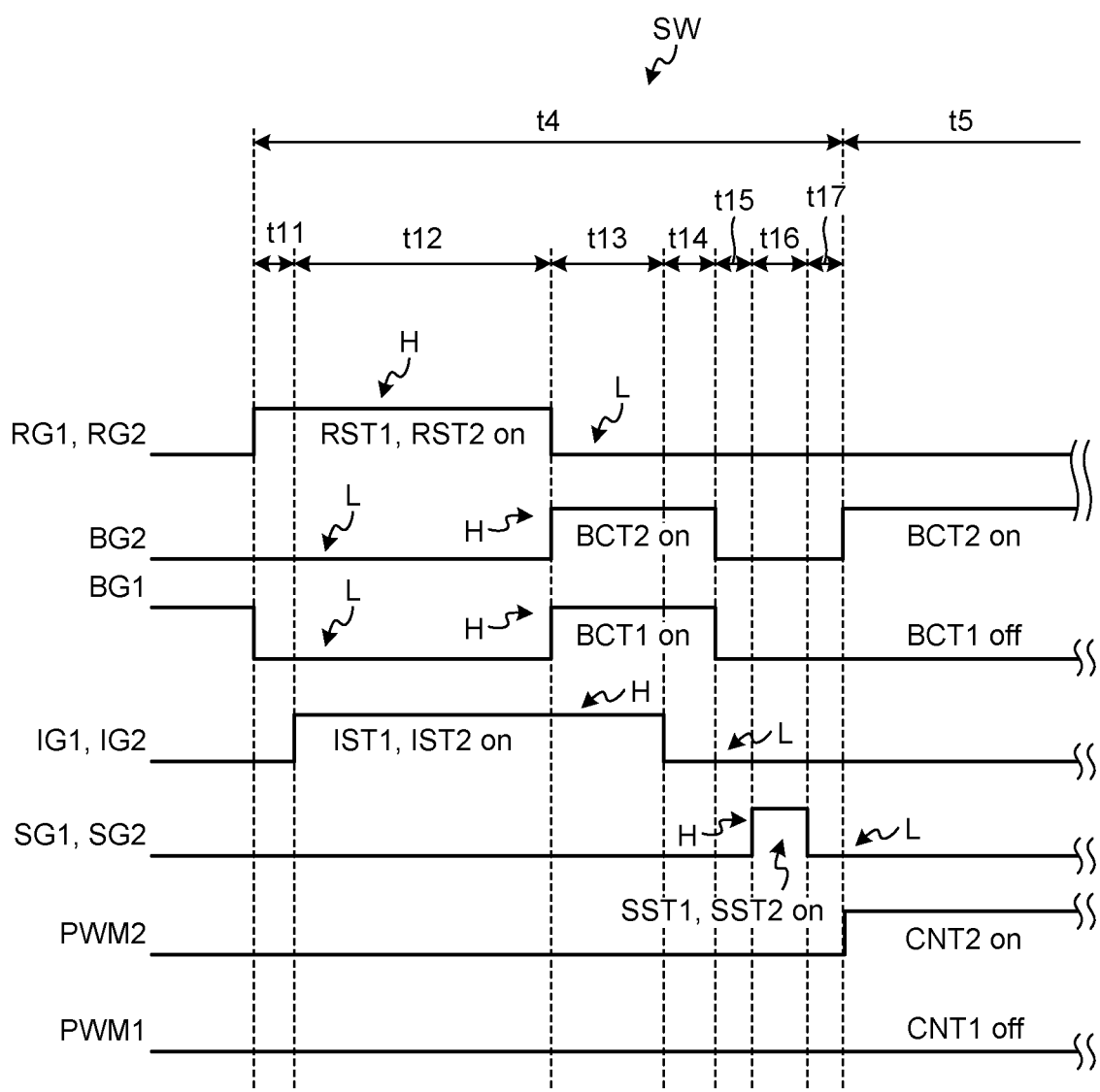
FIG. 6 is a timing chart for explaining an example of operations in a writing period illustrated in FIG. 5.

The following describes the video signal writing operation period in greater detail with reference to FIG. 6. FIG. 6 is a timing chart for explaining an example of operations in the writing period illustrated in FIG. 5. While FIG. 6 illustrates an image signal writing operation period SW illustrated in a period t4 in FIG. 5 in an enlarged manner, the description of the image signal writing operation period SW in the period t4 can also be applied to the image signal writing operation period in the period t1. In the period before the period t1, the sub-pixels SPX continues the light emission state in the previous frame.

As illustrated in FIG. 6, a period t11 is a source initialization period of the drive transistor DRT. Specifically, in the period t1, the potential (the first light emission control signal BG1 and the second light emission control signal BG2) of the light emission control scanning line L6 is at the L level, and the potential (the first reset control signal RG1 and the second reset control signal RG2) of the reset control signal line L5 is at the H level by the control signals supplied from the scanning line drive circuit 12 and the light emission control circuit 14. As a result, the light emission control transistor BCT is turned off (non-coupled state), and the reset transistor RST is turned on (electrically coupled state).

In the video signal writing operation period, the first coupling control signal PWM1 and the second coupling control signal PWM2 are at the L level from the period t11 to a period t17, and the coupling switching transistor CNT is turned off. In other words, the light-emitting element 100 is not coupled to the first pixel circuit 50*a* or the second pixel circuit 50*b* in the video signal writing operation period, which is a non-emission period of the light-emitting element 100. This configuration can prevent the potentials generated in the node N1 of the first pixel circuit 50*a* and the node N2 of the second pixel circuit 50*b* in the video signal writing operation period from being applied to the light-emitting element 100. Thus, the present embodiment can prevent an unintended reverse bias potential from being applied to the light-emitting element 100 and suppress damage to the light-emitting element 100.

In the period t11, the current from the anode power supply line L1 is blocked by the light emission control transistor BCT, and the coupling switching transistor CNT is turned off as described above. The light-emitting element 100 stops emitting light, and the residual charge in the sub-pixels SPX flows to the outside through the reset transistor RST. As a result, the source of the drive transistor DRT is fixed at the reset power supply potential Vrst.

The subsequent period t12 is a gate initialization period of the drive transistor DRT. Specifically, in the period t12, the potential (the first initialization control signal IG1 and the second initialization control signal IG2) of the initialization control signal line L8 is at the H level by the control signals supplied from the scanning line drive circuit 12 and the light emission control circuit 14. The initialization transistor IST is turned on. In the sub-pixels SPX belonging to the first partial display region AAs1, the gate of the drive transistor DRT is fixed at the initialization potential $Vini$ via the initialization transistor IST. The initialization potential $Vini$ is larger than a threshold of the drive transistor DRT with respect to the reset power supply potential Vrst. Therefore, the drive transistor DRT is turned on. In the period t12, however, no current flows to the drive transistor DRT because the light emission control transistor BCT remains off.

The subsequent period t13 is an offset cancellation operation period. Specifically, in the period t13, the potential (the first light emission control signal BG1 and the second light emission control signal BG2) of the light emission control scanning line L6 is at the H level, and the potential (the first reset control signal RG1 and the second reset control signal RG2) of the reset control signal line L5 is at the L level by the control signals supplied from the scanning line drive circuit 12 and the light emission control circuit 14. As a result, the light emission control transistor BCT is turned on, and the reset transistor RST is turned off.

The drive transistor DRT is in the ON state due to the operation in the period t12. Therefore, the current is supplied from the anode power supply line L1 (power supply voltage PVDD) to the drive transistor DRT via the light emission control transistor BCT.

At this stage, the coupling switching transistor CNT is off, and no current flows to the light-emitting element 100. Therefore, the source of the drive transistor DRT is charged by the power supply voltage PVDD, and the potential of the source rises. The gate potential of the drive transistor DRT is the initialization potential $Vini$. Therefore, the drive transistor DRT is turned off when the source potential of the drive transistor DRT reaches ($Vini$-Vth), and the rise in potential stops. Vth denotes a threshold voltage Vth of the drive transistor DRT.

The threshold voltage Vth varies with the sub-pixels SPX (and with the pixel circuits 50). Therefore, the potential of the source of the drive transistor DRT when the rise in potential stops varies with the sub-pixels SPX (and with the pixel circuits 50). In other words, the voltage corresponding to the threshold voltage Vth of the drive transistor DRT is obtained in each sub-pixel SPX by the operation in the period t13.

Subsequently, in periods t14 and t15, the initialization transistor IST and the light emission control transistor BCT are sequentially turned off. In the subsequent period t16, the potential (the first writing control signal SG1 and the second writing control signal SG2) of the writing control scanning line L7 is at the H level by the control signals supplied from the scanning line drive circuit 12 and the light emission control circuit 14.

As a result, the light emission control transistor BCT is turned off, the initialization transistor IST is turned off, and the writing transistor SST is turned on. In a period t16, the video signal VSG is input to the gate of the drive transistor DRT in the sub-pixels SPX belonging to the first partial display region AAs1. The gate potential of the drive transistor DRT changes from the initialization potential Vini to the potential of the video signal VSG. By contrast, the potential of the source of the drive transistor DRT is maintained at (Vini−Vth). As a result, the voltage between the gate and the source of the drive transistor DRT is (VSG−(Vini−Vth)), which reflects variations in the threshold voltage Vth between the sub-pixels SPX.

Referring back to FIG. 5, in the period t1, the first video signal VSG1-1 is input to the gate of the first drive transistor DRT1 of the first pixel circuit 50a in the sub-pixels SPX belonging to the writing control scanning line L7 that is at the H level by the operations in the video signal writing operation period described above. The gate potential of the first drive transistor DRT1 changes to the potential of the first video signal VSG1-1 due to the video signal writing operation in the period t1. In the same period, the second video signal VSG2-1 is input to the gate of the second drive transistor DRT2 of the second pixel circuit 50b. The gate potential of the second drive transistor DRT2 changes to the potential of the second video signal VSG2-1.

As illustrated in FIG. 5, in periods t1a and t1b subsequent to the period t1, display based on the first video signal VSG1-1 and the second video signal VSG2-1 are both performed by what is called a PWM drive system.

The periods t1a and t1b after the period t1 are a light emission operation period. In the periods t1a and t1b, display by what is called the PWM drive system is performed based on the first video signal VSG1-1 and the second video signal VSG2-1. The PWM drive system expresses gradation of the light-emitting element 100 according to the length of the pulse width of the light emission control signal BG output from the light emission control circuit 14 to the light emission control scanning line L6. When the light-emitting element 100 is turned on by the PWM drive system, the brightness is preferably the maximum luminance of the light-emitting element 100. Therefore, all the video signals input in the period t1 according to the present embodiment are the video signals VSG (signal potential) corresponding to what is called the maximum luminance of the light-emitting element 100. Thus, in the PWM drive system period, the gradation of the light-emitting element 100 is controlled by either the maximum luminance or a luminance of 0. In the following description, the video signal VSG supplied in the display period by the PWM drive system may be referred to as a digital signal.

Specifically, in the period t1a, the first light emission control signal BG1 supplied to the first light emission control scanning line La is at the H level, and the second light emission control signal BG2 supplied to the second light emission control scanning line L6b is at the L level by the control signals supplied from the scanning line drive circuit 12 and the light emission control circuit 14. The writing control scanning lines L7-1, L7-2, and L7-270 in the first partial display region AAs1 are at the L level.

As a result, the first light emission control transistor BCT1 of the first pixel circuit 50a is turned on, and the first writing transistor SST1 is turned off. Furthermore, in the light emission operation period, the first coupling switching transistor CNT1 is turned on. The power supply voltage PVDD is supplied to the first drive transistor DRT1 via the first light emission control transistor BCT1. The first drive transistor DRT1 supplies a current corresponding to the gate-source voltage set in the period t1 to the light-emitting element 100. In other words, the first drive transistor DRT1 is substantially completely turned on by the video signal, and the light-emitting element 100 emits light at the maximum luminance due to the potential difference PVDD-PVSS.

In the period t1a, the period of time (pulse width) during which the first light emission control transistor BCT1 is turned on is set to such a period of time that a target luminance level of 12.5% is achieved with respect to the maximum lighting luminance. In the period t1a, no current flows from the second drive transistor DRT2 to the light-emitting element 100 because the second light emission control transistor BCT2 of the second pixel circuit 50b is off. However, the voltage between the gate and the source of the second drive transistor DRT2 is held by the second holding capacitance Cs2. In the period t1a, fluctuations in the voltage between the gate and the source of the second drive transistor DRT2 due to the current from the first drive transistor DRT1 are suppressed because the second coupling switching transistor CNT2 of the second pixel circuit 50b is off.

Subsequently, in the period t1b, the first light emission control signal BG1 supplied to the first light emission control scanning line L6a is at the L level, and the second light emission control signal BG2 supplied to the second light emission control scanning line L6b is at the H level by the control signals supplied from the scanning line drive circuit 12 and the light emission control circuit 14. The writing control scanning lines L7-1, L7-2, . . . , and L7-270 in the first partial display region AAs1 are maintained at the L level.

As a result, the second light emission control transistor BCT2 of the second pixel circuit 50b is turned on, and the second writing transistor SST2 is turned off. Furthermore, the second coupling switching transistor CNT2 is turned on. The power supply voltage PVDD is supplied to the second drive transistor DRT2 via the second light emission control transistor BCT2. The second drive transistor DRT2 supplies a current corresponding to the gate-source voltage set in the period t1 to the light-emitting element 100. In other words, the second drive transistor DRT2 is substantially completely turned on by the digital signal, and the light-emitting element 100 emits light at the maximum luminance based on the potential difference PVDD-PVSS.

In the period t1b, the period of time (pulse width) during which the second light emission control transistor BCT2 is turned on is set to such a period of time that a target luminance level of 50% is achieved with respect to the maximum lighting luminance. In other words, the period t1b is longer than the period t1a, and the period t1b according to the present embodiment is four times the length of the period t1a. In the period t1b, no current flows from the first drive transistor DRT1 to the light-emitting element 100 because the first light emission control transistor BCT1 of the first pixel circuit 50a is off. In the period t1b, fluctuations in the voltage between the gate and the source of the first drive transistor DRT1 due to the current from the second drive transistor DRT2 are suppressed because the first coupling switching transistor CNT1 of the first pixel circuit 50a is off.

In both the periods t1a and t1b, which are light emission periods, the light-emitting element 100 is turned on at the maximum luminance. By contrast, the period t1a has a shorter light emission period than the period 1b. Therefore, the luminance of the light-emitting element 100 can be changed by switching on/off the light-emitting element 100 in the periods t1a and t1b. More specifically, if the light-emitting element 100 is turned on at the maximum luminance in both the periods t1a and t1b, a user of the display device 1 visually recognizes that the light-emitting element 100 is turned on at the brightest luminance during the period over the periods t1a and t1b due to an integral effect of the human eye (luminance at this time is defined as luminance A).

By contrast, let us assume a case where the light-emitting element 100 is turned on only in the period t1b in the periods t1a and t1b. In this case, if the light-emitting element 100 is turned on at the maximum luminance in the period t1b, the luminance is darker than the luminance A when viewed in the entire period over the periods t1a and t1b due to an integral effect in the time axis direction. As a result, the user visually recognizes that the light-emitting element 100 is turned on at luminance B darker than the luminance A.

Let us assume a case where the light-emitting element 100 is turned on only in the period t1a in the periods t1a and t1b. In this case, if the light-emitting element 100 is turned on at the maximum luminance in the period t1a, the luminance is darker than the luminance B when viewed in the entire period over the periods t1a and t1b due to the integral effect in the time axis direction. As a result, the user visually recognizes that the light-emitting element 100 is turned on at luminance C darker than the luminance B. Thus, the PWM drive system changes the luminance depending on the length of the lighting period of the light-emitting element 100.

In the period t2 to the period t3 overlapping the periods t1a and t1b, the video signal writing operations for the second partial display region AAs2 to the fourth partial display region AAs4 are sequentially performed. In periods t2a, t2b, t5a, and t5b, the light emission operation for the second partial display region AAs2 is performed in the same manner as that for the first partial display region AAs1.

In the period t4, the video signal writing operation for the first partial display region AAs1 is performed in the same manner as in the period t1. The gate potential of the first drive transistor DRT1 changes to the potential of the first video signal VSG1-2 due to the video signal writing operation in the period t4. The gate potential of the second drive transistor DRT2 changes to the potential of the second video signal VSG2-2.

Subsequently, in a period t4a, the first light emission control signal BG1 supplied to the first light emission control scanning line L6a is at the L level, and the second light emission control signal BG2 supplied to the second light emission control scanning line L6b is at the H level by the control signals supplied from the scanning line drive circuit 12 and the light emission control circuit 14. The writing control scanning lines L7-1, L7-2, . . . , and L7-270 in the first partial display region AAs1 are at the L level. The operations of the transistors of the second pixel circuit 50b in the period t4a are the same as those in the period t1b described above, and repeated explanation thereof is omitted.

As illustrated in FIG. 5, the period t4a subsequent to the period t4 is one period of display by the PWM drive system. By contrast, a period t4b is a display period by analog gradation. In display by analog gradation, the lighting period is fixed to a predetermined period, the pixel signal (video signal VSG) is an analog potential, the ON state of the gate of the drive transistor DRT is adjusted according to the analog potential, and the current from the power supply voltage PVDD to the light-emitting element 100 has a magnitude corresponding to the ON-state of the gate. Therefore, the luminance of the light-emitting element 100 is the brightness corresponding to the analog potential of the pixel signal (video signal VSG). More specifically, the brightness of the light-emitting element 100 based on the pixel signal (video signal VSG) of the analog potential has one of the brightnesses from a luminance of 0 to predetermined luminance. In other words, if the period is the PWM drive system period, the light-emitting element 100 emits light only at the maximum luminance or a luminance of 0 over the period. In the display period by analog gradation, the light-emitting element 100 emits light at one of the luminance levels between a luminance of 0 and the maximum luminance by gradation expression using the analog potential. In the following description, display by analog gradation may be referred to as the analog drive system.

The pixel signal supplied to the pixel circuit 50 in the display period by the analog drive system can be set to the value corresponding to what is called 0 to 255 gradations. In the present embodiment, however, luminance expression using the pixel signal is approximately 0 to 32 gradations considering that the period for performing gradation expression based on the analog potential is 12.5% of the entire lighting period.

In the period t4a, the period of time (pulse width) during which the second light emission control transistor BCT2 is turned on is set to such a period of time that a target luminance level of 25% is achieved with respect to the maximum lighting luminance. In the period t4a, no current flows from the first drive transistor DRT1 to the light-emitting element 100 because the first light emission control transistor BCT1 of the first pixel circuit 50a is off.

Subsequently, in the period t4b, the first light emission control signal BG1 supplied to the first light emission control scanning line L6a is at the H level, and the second light emission control signal BG2 supplied to the second light emission control scanning line L6b is at the L level by the control signals supplied from the scanning line drive circuit 12 and the light emission control circuit 14. The writing control scanning lines L7-1, L7-2, . . . , and L7-270 in the first partial display region AAs1 are maintained at the L level. The operations of the transistors of the first pixel circuit 50a in the period t4b are the same as those in the period t1a described above, and repeated explanation thereof is omitted.

In the period t4b, the current (first drive current) corresponding to the first video signal VSG1-2 serving as an analog signal is supplied to the light-emitting element 100 from the first drive transistor DRT1. The period of time (pulse width) during which the first light emission control transistor BCT1 is turned on is fixed to such a period of time that a target luminance level of 12.5% is achieved with respect to the maximum lighting luminance. The potential of the first video signal VSG1-2 in the period t4b is set for each sub-pixel SPX by the drive signal controller 200. In the period t4b, no current flows from the second drive transistor DRT2 to the light-emitting element 100 because the second light emission control transistor BCT2 of the second pixel circuit 50b is off.

When the operations described above are completed from the second partial display region AAs2 to the fourth partial display region AAs4, an image of one frame is displayed.

The drive signal controller 200 (refer to FIG. 3) can control the luminance (gradation) of the light-emitting element 100 by the sum of the light emission operation periods of the periods t1a and t1b and the periods t4a and t4b. More specifically, 87.5% of the luminance of the optical element is composed of the display period by the PWM drive system based on the video signal of the digital potential (the first video signal VSG1-1 and the second video signals VSG2-1 and VSG2-2). The remaining 12.5% of the luminance is composed of the video signal of the analog potential (first video signal VSG1-2). The brightness of a luminance of 12.5% can be more finely set according to the analog potential. Therefore, extremely fine gradation expression can be achieved by combining the PWM drive system period and the analog drive system period.

In the example illustrated in FIG. 5, the current flows to the light-emitting element 100 in the entire periods of the periods t1a and t1b and the periods t4a and t4b to display a luminance of 100%. The drive signal controller 200 (refer to FIG. 3), however, controls turning on/off the light-emitting element 100 in the periods t1a and t1b and the periods t4a and t4b, thereby supplying a fixed current to the light-emitting element 100 for a period of time with a length corresponding to the video signal VSG. In addition, the drive signal controller 200 can appropriately control the luminance (gradation) by adjusting the current (first video signal VSG1-2) in the period t4b.

In the light emission period, the first coupling switching transistor CNT1 is controlled on and off in synchronization with the first light emission control transistor BCT1. The second coupling switching transistor CNT2 is controlled on and off in synchronization with the second light emission control transistor BCT2. As a result, in the periods t1a and t1b and the periods t4a and t4b, the light-emitting element 100 is coupled to one of the first pixel circuit 50a and the second pixel circuit 50b and is not coupled to the other of the first pixel circuit 50a and the second pixel circuit 50b.

Figure 7:
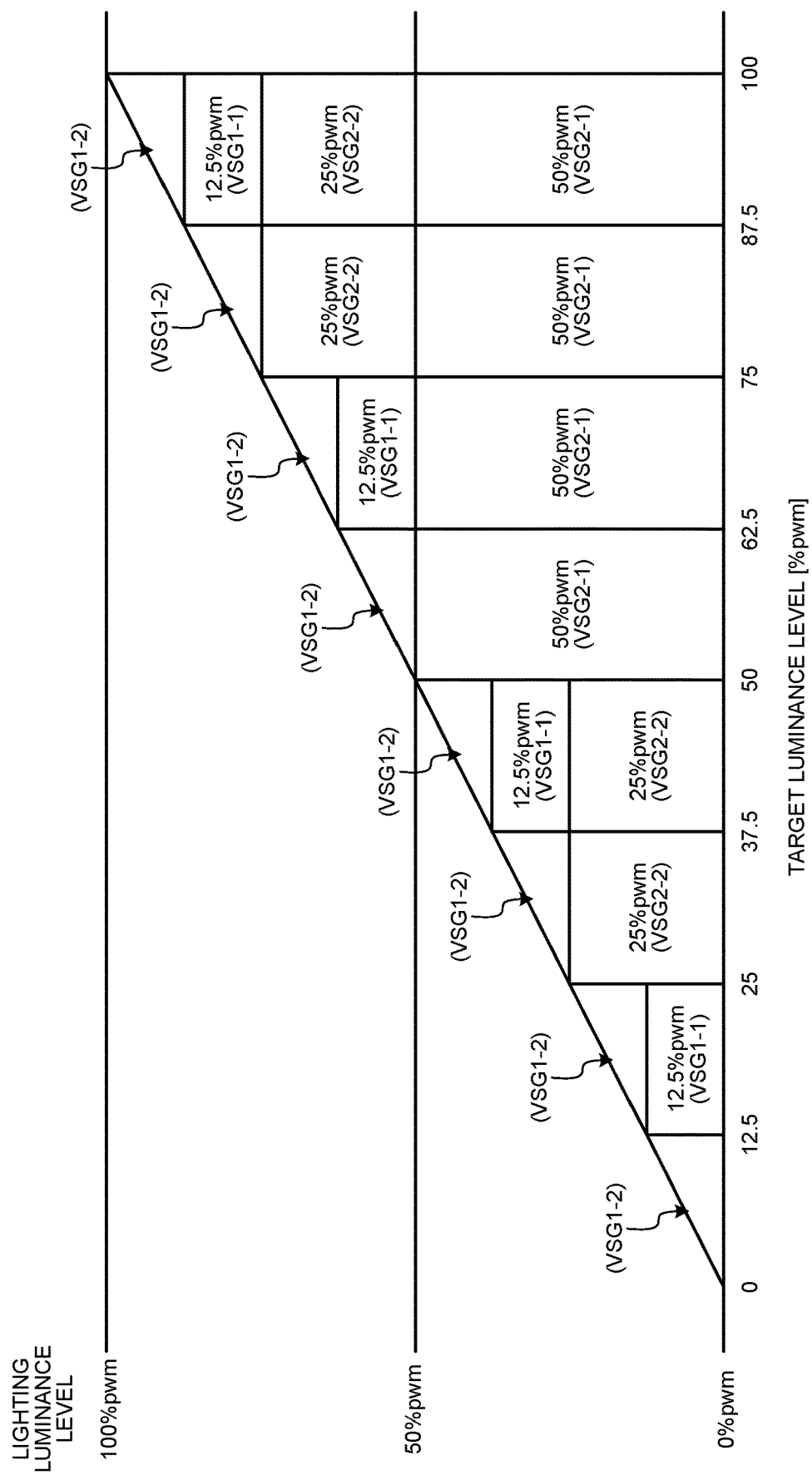
FIG. 7 is a diagram of an example of combination of a current drive system and a PWM drive system at each display luminance level.

FIG. 7 is a diagram of an example of combination of the current drive system and the PWM drive system at each display luminance level. As illustrated in FIG. 7, in the range where the target luminance level is larger than 0% and equal to or smaller than 12.5%, the drive signal controller 200 turns on the first light emission control transistor BCT1 in the period t4b and supplies the current (first video signal VSG1-2) to the light-emitting element 100 to adjust the lighting luminance level. Specifically, the drive signal controller 200 turns off the first light emission control transistor BCT1 and the second light emission control transistor BCT2 in the periods t1a and t1b and the period t4a. In other words, the light-emitting element 100 is off (does not emit light) in the periods t1a and t1b and the period t4a.

In the range where the target luminance level is larger than 12.5% and equal to or smaller than 25%, the drive signal controller 200 turns on the first light emission control transistor BCT1 in the period t1a and supplies the current (first video signal VSG1-1) to the light-emitting element 100 for a period of time with the length corresponding to a target luminance level of 12.5%. The drive signal controller 200 turns on the first light emission control transistor BCT1 in the period t4b and supplies the current (first video signal VSG1-2) to the light-emitting element 100 to adjust the lighting brightness level in a range of 12.5% to 25% or smaller. In other words, the drive signal controller 200 turns off the first light emission control transistor BCT1 and the second light emission control transistor BCT2 in the period t1b and the period t4a. In other words, the light-emitting element 100 is off (does not emit light) in the period t1b and the period t4a.

In the range where the target luminance level is larger than 25% and equal to or smaller than 37.5%, the drive signal controller 200 turns on the second light emission control transistor BCT2 in the period t4a and supplies the current (second video signal VSG2-2) to the light-emitting element 100 for a period of time with the length corresponding to a target luminance level of 25%. The drive signal controller 200 turns on the first light emission control transistor BCT1 in the period t4b and supplies the current (first video signal VSG1-2) to the light-emitting element 100 to adjust the lighting brightness level in a range of 25% to 37.5% or smaller. In other words, the drive signal controller 200 turns off the first light emission control transistor BCT1 and the second light emission control transistor BCT2 in the period t1a and the period t1b. In other words, the light-emitting element 100 is off (does not emit light) in the periods t1a and t1b.

In the range where the target luminance level is larger than 37.5% and equal to or smaller than 50%, the drive signal controller 200 turns on the first light emission control transistor BCT1 and the second light emission control transistor BCT2 in the period t1a and the period t4a and supplies the current (the first video signal VSG1-1 and the second video signal VSG2-2) to the light-emitting element 100 for a period of time with the length corresponding to a target luminance level of 12.5% and a period of time with the length corresponding to a target luminance level of 25%. The drive signal controller 200 turns on the first light emission control transistor BCT1 in the period t4b and supplies the current (first video signal VSG1-2) to the light-emitting element 100 to adjust the lighting brightness level in a range of 37.5% to 50% or smaller. Specifically, the drive signal controller 200 turns off the first light emission control transistor BCT1 and the second light emission control transistor BCT2 in the period t1b. In other words, the light-emitting element 100 is off (does not emit light) in the period t1b.

In the same manner as described above, the drive signal controller 200 combines the current (the first video signal VSG1-1 and the second video signals VSG2-1 and VSG2-2) and the current (first video signal VSG1-2) to achieve display at the lighting luminance level.

Figure 8:
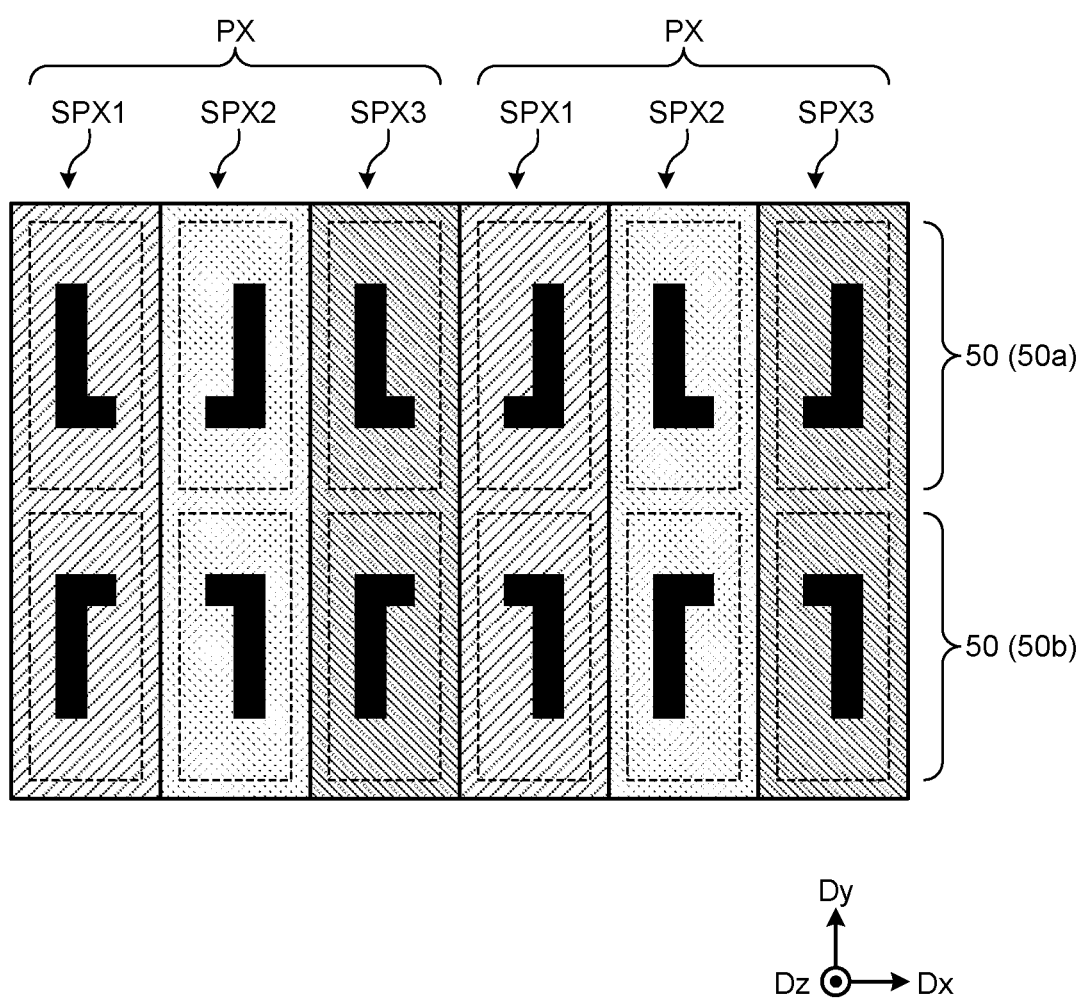
FIG. 8 is a schematic for explaining the arrangement relation between first pixel circuits and second pixel circuits in a plurality of sub-pixels according to the embodiment.

The following describes an exemplary configuration of the first pixel circuit 50a and the second pixel circuit 50b in a plurality of sub-pixels SPX. FIG. 8 is a schematic for explaining the arrangement relation between the first pixel circuits and the second pixel circuits in a plurality of sub-pixels according to the embodiment. In FIG. 8, the first sub-pixel SPX1, the second sub-pixel SPX2, and the third sub-pixel SPX3 are each hatched. The L-shaped patterns in the sub-pixels SPX are given to schematically illustrate the arrangement relation (symmetry of arrangement) of the transistors and the wiring included in the sub-pixels SPX and do not represent the arrangement pattern and the shape of the actual transistors and wiring.

As illustrated in FIG. 8, a plurality of pixels PX are arrayed in the first direction Dx. In the first direction Dx, the first sub-pixel SPX1, the second sub-pixel SPX2, the third sub-pixel SPX3, the first sub-pixel SPX1, the second sub-pixel SPX2, and the third sub-pixel SPX3 are repeatedly arrayed in this order. In each sub-pixel SPX, the first pixel circuit 50a and the second pixel circuit 50b are disposed side by side in the second direction Dy.

As schematically indicated by the L-shaped patterns, in one sub-pixel SPX, the arrangement pattern of the transistors and the wiring of the first pixel circuit 50a and the arrangement pattern of the transistors and the wiring of the second pixel circuit 50b are disposed in line symmetry with respect to the axis of symmetry parallel to the first direction Dx. In the example illustrated in FIG. 8, in one sub-pixel SPX, the arrangement pattern of the transistors and the wiring of the first pixel circuit 50a is an arrangement pattern obtained by vertically inverting the arrangement pattern of the transistors and the wiring of the second pixel circuit 50b.

In two sub-pixels SPX adjacently disposed in the first direction Dx (e.g., the leftmost first sub-pixel SPX1 in FIG. 8 and the second sub-pixel SPX2 adjacent thereto), the first pixel circuit 50a and the second pixel circuit 50b of one sub-pixel SPX (first sub-pixel SPX1) and the first pixel circuit 50a and the second pixel circuit 50b of the other sub-pixel SPX (second sub-pixel SPX2) are disposed in line symmetry with respect to the axis of symmetry parallel to the second direction Dy. In the example illustrated in FIG. 8, in two adjacent sub-pixels SPX, the arrangement pattern of the transistors and the wiring of the first pixel circuit 50a and the second pixel circuit 50b of one sub-pixel SPX is an arrangement pattern obtained by horizontally inverting that of the other sub-pixel SPX.

Focusing on two pixels PX adjacently disposed in the first direction Dx, the arrangement pattern of the first sub-pixel SPX1 of one pixel PX (left pixel PX in FIG. 8) is an arrangement pattern obtained by horizontally inverting that of the first sub-pixel SPX1 of the other pixel PX (right pixel PX in FIG. 8). In other words, the first sub-pixel SPX1, the second sub-pixel SPX2, the third sub-pixel SPX3, the first sub-pixel SPX1, the second sub-pixel SPX2, and the third sub-pixel SPX3 are repeatedly arrayed in this order in the first direction Dx. In the two first sub-pixels SPX1 adjacently disposed with the second sub-pixel SPX2 and the third sub-pixel SPX3 interposed therebetween, the first pixel circuit 50a and the second pixel circuit 50b of one first sub-pixel SPX1 and the first pixel circuit 50a and the second pixel circuit 50b of the other first sub-pixel SPX1 are disposed in line symmetry with respect to the axis of symmetry parallel to the second direction Dy.

Thus, by forming the arrangement patterns of the transistors and the wiring in an inverted manner in adjacent sub-pixel SPX, the adjacent sub-pixels SPX can share the wiring, and the arrangement pitch of the sub-pixels SPX can be reduced. In addition, by forming the arrangement patterns of the transistors and the wiring in an inverted manner in the first pixel circuit 50a and the second pixel circuit 50b adjacently disposed in the second direction Dy, the first pixel circuit 50a and the second pixel circuit 50b adjacently disposed can share the wiring and be efficiently disposed in one sub-pixel SPX.

Figure 9:
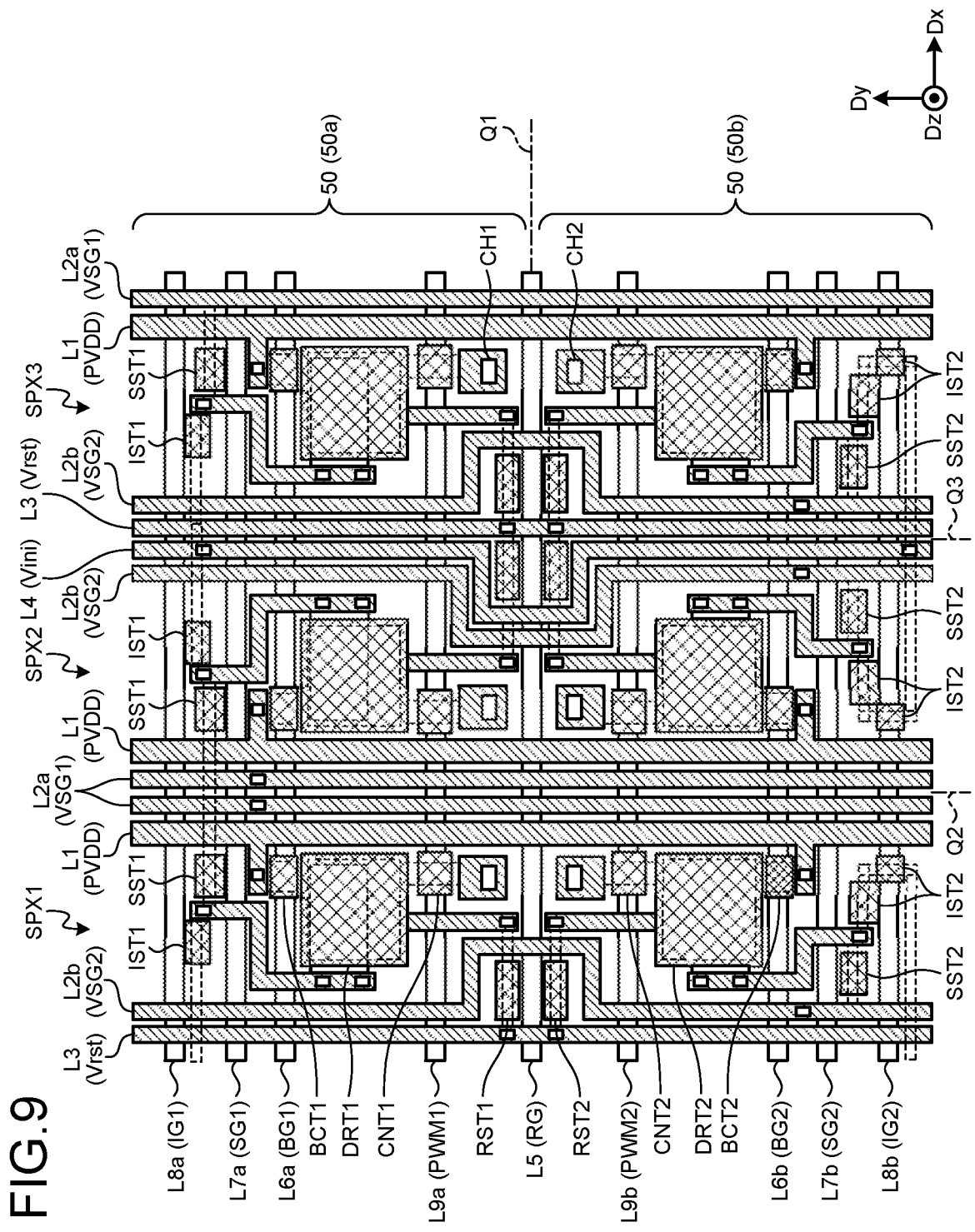
FIG. 9 is a plan view schematically illustrating an exemplary configuration of a plurality of sub-pixels according to the embodiment.

FIG. 9 is a plan view schematically illustrating an exemplary configuration of a plurality of sub-pixels according to the embodiment. FIG. 9 illustrates an exemplary configuration of the first sub-pixel SPX1, the second sub-pixel SPX2, and the third sub-pixel SPX3 arrayed in the first direction Dx. The electrical coupling relation between the transistors and the wiring of the first pixel circuit 50a and the second pixel circuit 50b illustrated in FIG. 9 are the same as those described above with reference to FIG. 4, and redundant explanation thereof is omitted.

As illustrated in FIG. 9, focusing on one sub-pixel SPX (e.g., the first sub-pixel SPX1), the transistors of the first pixel circuit 50a and the transistors of the second pixel circuit 50b are disposed in line symmetry with respect to an axis of symmetry Q1 parallel to the first direction Dx. More specifically, in the first pixel circuit 50a, the first reset transistor RST1, the first coupling switching transistor CNT1, the first drive transistor DRT1, the first light emission control transistor BCT1, the first writing transistor SST1, and the first initialization transistor IST1 are disposed in this order from the axis of symmetry Q1 to a first side (upper side in FIG. 9) in the second direction Dy.

In the second pixel circuit 50b, the second reset transistor RST2, the second coupling switching transistor CNT2, the second drive transistor DRT2, the second light emission control transistor BCT2, the second writing transistor SST2, and the second initialization transistor IST2 are disposed in this order from the axis of symmetry Q1 to a second side (lower side in FIG. 9) in the second direction Dy.

The light-emitting element 100 (not illustrated in FIG. 9) is coupled to the first coupling switching transistor CNT1 via a contact portion CH1 and to the second coupling switching transistor CNT2 via a contact portion CH2.

The wiring of the first pixel circuit 50a and the wiring of the second pixel circuit 50b are disposed in line symmetry with respect to the axis of symmetry Q1 parallel to the first direction Dx. More specifically, in the first pixel circuit 50a, the reset control signal line L5, the first coupling control scanning line L9a, the first light emission control scanning line L6a, the first writing control scanning line L7a, and the first initialization control signal line L8a are disposed in this order from the axis of symmetry Q1 to the first side (upper side in FIG. 9) in the second direction Dy.

In the second pixel circuit 50b, the reset control signal line L5, the second coupling control scanning line L9b, the second light emission control scanning line L6b, the second writing control scanning line L7b, and the second initialization control signal line L8b are disposed in this order from the axis of symmetry Q1 to the second side (lower side in FIG. 9) in the second direction Dy.

As illustrated in FIG. 9, one reset control signal line L5 is shared by the first pixel circuit 50a and the second pixel circuit 50b. In other words, the first reset transistor RST1 of the first pixel circuit 50a and the second reset transistor RST2 of the second pixel circuit 50b are adjacently disposed in the second direction Dy with the reset control signal line L5 interposed therebetween. The gate of the first reset transistor RST1 of the first pixel circuit 50a and the gate of the second reset transistor RST2 of the second pixel circuit 50b are coupled to the common reset control signal line L5.

Focusing on two sub-pixels SPX (e.g., the first sub-pixel SPX1 and the second sub-pixel SPX2) adjacently disposed in the first direction Dx, the first pixel circuit 50a and the second pixel circuit 50b of one sub-pixel SPX (first sub-pixel SPX1) and the first pixel circuit 50a and the second pixel circuit 50b of the other sub-pixel SPX (second sub-pixel SPX2) are disposed in line symmetry with respect to an axis of symmetry Q2 parallel to the second direction Dy. In other words, the transistors of the first sub-pixel SPX1 and the transistors of the second sub-pixel SPX2 are disposed in line symmetry with respect to the axis of symmetry Q2. The axis of symmetry Q2 is positioned between the first video signal line L2a coupled to the first sub-pixel SPX1 and the first video signal line L2a coupled to the second sub-pixel SPX2.

In other words, the reset transistor RST, the coupling switching transistor CNT, the drive transistor DRT, the light emission control transistor BCT, the initialization transistor IST, and the writing transistor SST of the second sub-pixel SPX2 and the reset transistor RST, the coupling switching transistor CNT, the drive transistor DRT, the light emission control transistor BCT, the initialization transistor IST, and the writing transistor SST of the first sub-pixel SPX1 have an arrangement relation horizontally inverted with respect to the axis of symmetry Q2.

The first sub-pixel SPX1 includes the reset power supply line L3, the second video signal line L2b, the anode power supply line L1, and the first video signal line L2a. The reset power supply line L3, the second video signal line L2b, the anode power supply line L1, and the first video signal line L2a are arrayed in this order in the first direction Dx. The coupling switching transistor CNT, the drive transistor DRT, the light emission control transistor BCT, the initialization transistor IST, and the writing transistor SST are disposed between the second video signal line L2b and the anode power supply line L1 adjacently disposed in the first direction Dx. The reset transistor RST is disposed between the reset power supply line L3 and the second video signal line L2b.

The reset power supply line L3 is shared by the first pixel circuit 50a and the second pixel circuit 50b of the first sub-pixel SPX1. In other words, in one first sub-pixel SPX1, the first reset transistor RST1 of the first pixel circuit 50a and the second reset transistor RST2 of the second pixel circuit 50b are coupled to the common reset power supply line L3. The anode power supply line L1 is shared by the first pixel circuit 50a and the second pixel circuit 50b of the first sub-pixel SPX1. In other words, in one first sub-pixel SPX1, the first light emission control transistor BCT1 of the first pixel circuit 50a and the second light emission control transistor BCT2 of the second pixel circuit 50b are coupled to the common anode power supply line L1. The first video signal line L2a is provided corresponding to the first pixel circuit 50a of the first sub-pixel SPX1. The second video signal line L2b is provided corresponding to the second pixel circuit 50b of the first sub-pixel SPX1.

Focusing on the second sub-pixel SPX2 adjacent to the first sub-pixel SPX1 in the first direction Dx, the second sub-pixel SPX2 includes the first video signal line L2a, the anode power supply line L1, the second video signal line L2b, and the initialization power supply line L4. The first video signal line L2a, the anode power supply line L1, the second video signal line L2b, and the initialization power supply line L4 are arrayed in this order in the first direction Dx. The initialization power supply line L4 is shared by the first pixel circuit 50a and the second pixel circuit 50b of the first sub-pixel SPX1. The anode power supply line L1 is shared by the first pixel circuit 50a and the second pixel circuit 50b of the second sub-pixel SPX2. The first video signal line L2a is provided corresponding to the first pixel circuit 50a of the second sub-pixel SPX2. The second video signal line L2b is provided corresponding to the second pixel circuit 50b of the second sub-pixel SPX2.

In the first sub-pixel SPX1 and the second sub-pixel SPX2, the first video signal line L2a, the anode power supply line L1, and the second video signal line L2b are disposed in line symmetry with respect to the axis of symmetry Q2. By contrast, the reset power supply line L3 of the first sub-pixel SPX1 and the initialization power supply line L4 of the second sub-pixel SPX2 are disposed in asymmetry with respect to the axis of symmetry Q2.

In the first sub-pixel SPX1 and the second sub-pixel SPX2, the first sub-pixel SPX1 includes the reset power supply line L3 and does not include the initialization power supply line L4. The second sub-pixel SPX2 does not include the reset power supply line L3 and includes the initialization power supply line L4. The reset power supply line L3 and the initialization power supply line L4 according to the present embodiment are shared by two sub-pixels SPX adjacently disposed in the first direction Dx. With this configuration, the arrangement pitch of the sub-pixels SPX in the first direction Dx can be reduced compared with a case where the reset power supply line L3 and the initialization power supply line L4 are provided to each sub-pixel SPX.

Also in the second sub-pixel SPX2 and the third sub-pixel SPX3, the first pixel circuit 50a and the second pixel circuit 50b of one sub-pixel SPX (second sub-pixel SPX2) and the first pixel circuit 50a and the second pixel circuit 50b of the other sub-pixel SPX (third sub-pixel SPX3) are disposed in line symmetry with respect to an axis of symmetry Q3 parallel to the second direction Dy. In other words, the transistors and the wiring of the third sub-pixel SPX3 have an arrangement relation similar to those of the first sub-pixel SPX1. The axis of symmetry Q3 is positioned between the initialization power supply line L4 provided to the second sub-pixel SPX2 and the reset power supply line L3 provided to the third sub-pixel SPX3.

Focusing on the second sub-pixel SPX2 and the third sub-pixel SPX3, one initialization power supply line L4 is shared by the first pixel circuit 50a and the second pixel circuit 50b of the second sub-pixel SPX2 and the first pixel circuit 50a and the second pixel circuit 50b of the third sub-pixel SPX3. In other words, one initialization power supply line L4 is coupled to four initialization transistors IST.

One reset power supply line L3 is shared by the first pixel circuit 50a and the second pixel circuit 50b of the second sub-pixel SPX2 and the first pixel circuit 50a and the second pixel circuit 50b of the third sub-pixel SPX3. In other words, one reset power supply line L3 is coupled to four reset transistors RST.

With the configuration described above, the transistors and the wiring can be efficiently disposed if the sub-pixels SPX each include two pixel circuits (the first pixel circuit 50a and the second pixel circuit 50b).

FIG. 9 is given by way of example only, and the arrangement of the transistors and the wiring may be appropriately modified. For example, some of the transistors included in the sub-pixels SPX may be disposed in asymmetry.

As described above, the display device 1 includes a plurality of light-emitting elements 100, a first pixel circuit 50a and a second pixel circuit 50b, a first drive transistor DRT1, a second drive transistor DRT2, a drive circuit (signal line drive circuit 13), a first coupling switching transistor CNT1, and a second coupling switching transistor CNT2. The light-emitting elements 100 are arrayed in the display region AA. The first pixel circuit 50a and the second pixel circuit 50b are coupled to each of the light-emitting elements 100. The first drive transistor DRT1 is provided to the first pixel circuit 50a and supplies a first drive current (current corresponding to the first video signal VSG1-2) to the light-emitting element 100. The second drive transistor DRT2 is provided to the second pixel circuit 50b and supplies a second drive current (e.g., a current corresponding to the second video signal VSG2-2) to the light-emitting element 100. The drive circuit supplies the video signal VSG to the first drive transistor DRT1 and the second drive transistor DRT2. The first coupling switching transistor CNT1 is provided between the first drive transistor DRT1 and the light-emitting element 100. The second coupling switching transistor CNT2 is provided between the second drive transistor DRT2 and the light-emitting element 100. The first coupling switching transistor CNT1 and the second coupling switching transistor CNT2 are turned off in the non-emission period of the light-emitting element 100.

With this configuration, the light-emitting element 100 is not coupled to the first pixel circuit 50a or the second pixel circuit 50b in the non-emission period of the light-emitting element 100 (video signal writing operation period) because the first coupling switching transistor CNT1 and the second coupling switching transistor CNT2 are provided. This configuration can prevent the potentials generated in the node N1 of the first pixel circuit 50a and the node N2 of the second pixel circuit 50b in the non-emission period from being applied to the light-emitting element 100. Thus, the present embodiment can prevent an unintended reverse bias potential from being applied to the light-emitting element 100 and suppress damage to the light-emitting element 100.

In the display device 1, the first drive transistor DRT1 provided to the first pixel circuit 50a supplies the first drive current set corresponding to the video signal VSG (current corresponding to the first video signal VSG1-2) to the light-emitting element 100, and the second drive transistor DRT2 provided to the second pixel circuit 50*b* supplies the fixed second drive current (e.g., a fixed current corresponding to the second video signals VSG2-1 and VSG2-2) to the light-emitting element 100 for a period of time with the length corresponding to the video signal VSG (periods t1*b* and t4*a*). The control circuit (drive signal controller 200) sets the light emission period by the first pixel circuit 50*a* to a predetermined period and changes the light emission period by the second pixel circuit 50*b*.

With this configuration, the display device 1 can satisfactorily perform gradation control by combining the PWM drive system that expresses gradation by combining the periods t1*a*, t1*b*, and t4*a* having different light emission periods and the analog drive system that expresses gradation by controlling the amount of current (first video signal VSG1-2) to the light-emitting element 100 in the period t4*a*.

In the display device 1, the light-emitting element 100 is driven by the first drive current in the range equal to or smaller than the maximum low gradation value defined by the maximum value of the first drive current (current corresponding to the first video signal VSG1-2) (e.g., the range equal to or smaller than a target luminance level of 12.5% in FIG. 7). The light-emitting element 100 is driven by at least the second drive current (e.g., at least one or more of the currents corresponding to the first video signal VSG1-1 and the second video signals VSG2-1 and VSG2-2) in the range on the high-gradation side larger than the maximum gradation value defined by the maximum value of the first drive current (e.g., the range larger than a target luminance level of 12.5% in FIG. 7).

With this configuration, the gradation control range can be made smaller than in a case where all the gradations are controlled by the current drive system. In the present embodiment, the current value of the PWM drive system is larger than that of the current drive system on the high-gradation side. Therefore, the present embodiment can suppress changes in light emission chromaticity due to variations in the current value.

In the display device 1, the first drive transistor DRT1 and the second drive transistor DRT2 are supplied with the video signal VSG in a common writing period (e.g., the periods t1 and t4) and supply the first drive current (current corresponding to the first video signal VSG1-2) and the second drive current (e.g., a current corresponding to the second video signals VSG2-1 and VSG2-2) to the light-emitting element 100 in a time-division manner.

In the display device 1, two pixel circuits 50, that is, the first pixel circuit 50*a* and the second pixel circuit 50*b* are provided for one light-emitting element 100. With this configuration, the display device 1 can cause the first pixel circuit 50*a* and the second pixel circuit 50*b* to perform the video signal writing operation in the same writing period (e.g., the period t1). Therefore, the display device 1 can reduce the time required for the video signal writing operation compared to a case where multi-gradation display is performed by one pixel circuit.

The pixel circuit 50 and the driving method illustrated in FIGS. 4 to 7 are given by way of example only and can be appropriately modified. For example, while the display device 1 implements the PWM drive system by combining the three periods t1*a*, t1*b*, and t2*a* with different lengths (pulse widths), the present embodiment is not limited thereto. The display device 1 may implement the PWM drive system by combining two different periods (pulse widths) or four or more different periods (pulse widths), for example.

As illustrated in FIG. 5, when comparing the display period by the PWM drive system, the period of the first pixel circuit 50*a* is longer than the period of the second pixel circuit 50*b*. Therefore, a configuration in which the first holding capacitance Cs1 is larger than the second holding capacitance Cs2 can also be employed.

While exemplary embodiments according to the present disclosure have been described, the embodiments are not intended to limit the disclosure. The contents disclosed in the embodiments are given by way of example only, and various modifications may be made without departing from the spirit of the present disclosure. Appropriate modifications made without departing from the spirit of the present disclosure naturally fall within the technical scope of the disclosure. At least one of various omissions, substitutions, and modifications of the components may be made without departing from the gist of the embodiments above and the modifications thereof.

What is claimed is:

1. A display device comprising:
    a plurality of light-emitting elements arrayed in a display region;
    a first pixel circuit and a second pixel circuit coupled to each of the light-emitting elements;
    a first drive transistor provided to the first pixel circuit and configured to supply a first drive current to the light-emitting element;
    a second drive transistor provided to the second pixel circuit and configured to supply a second drive current to the light-emitting element;
    a drive circuit configured to supply a video signal to the first drive transistor and the second drive transistor;
    a first coupling switching transistor provided between the first drive transistor and the light-emitting element; and
    a second coupling switching transistor provided between the second drive transistor and the light-emitting element, wherein
    the first coupling switching transistor and the second coupling switching transistor are turned off in a non-emission period of the light-emitting element.

2. The display device according to claim 1, wherein
    the first drive transistor provided to the first pixel circuit supplies the first drive current set corresponding to the video signal to the light-emitting element,
    the second drive transistor provided to the second pixel circuit supplies the second drive current that is fixed to the light-emitting element, and
    the control circuit sets a light emission period by the first pixel circuit to a predetermined period and changes a light emission period by the second pixel circuit.

3. The display device according to claim 2, wherein
    the light-emitting element is driven by the first drive current in a range on a low-gradation side equal to or smaller than the maximum gradation value defined by the maximum value of the first drive current, and
    the light-emitting element is driven by at least the second drive current in a range on a high-gradation side larger than the maximum gradation value defined by the maximum value of the first drive current.

4. The display device according to claim 2, wherein
    the first drive transistor provided to the first pixel circuit further supplies a drive current fixed like the second drive current as the first drive current to the light-emitting element, and the control circuit further sets a light emission period by the fixed drive current by the first pixel circuit.

5. The display device according to claim 1, wherein
the first drive transistor and the second drive transistor are supplied with the video signal in a common writing period, and
the first drive transistor and the second drive transistor supply the first drive current and the second drive current to the light-emitting element in a time-division manner.

6. The display device according to claim 1, further comprising:
a first reset transistor coupled to the first drive transistor and configured to supply a reset power supply potential to the first drive transistor; and
a second reset transistor coupled to the second drive transistor and configured to supply the reset power supply potential to the second drive transistor, wherein
a gate of the first reset transistor and a gate of the second reset transistor are coupled to a common reset control signal line.

7. The display device according to claim 6, further comprising:
a reset power supply line configured to supply the reset power supply potential, wherein
the first reset transistor of the first pixel circuit and the second reset transistor of the second pixel circuit are coupled to the common reset power supply line.

8. The display device according to claim 1, further comprising:
a plurality of sub-pixels arrayed in a first direction, wherein
the sub-pixels each comprise the light-emitting element, the first pixel circuit, and the second pixel circuit, and
the first pixel circuit and the second pixel circuit of one sub-pixel and the first pixel circuit and the second pixel circuit of the other sub-pixel in two of the sub-pixels adjacently disposed in the first direction are disposed in line symmetry with respect to an axis of symmetry parallel to a second direction intersecting the first direction.

9. The display device according to claim 8, wherein the first pixel circuit and the second pixel circuit in each of the sub-pixels are disposed in line symmetry with respect to an axis of symmetry parallel to the first direction.

10. The display device according to claim 8, wherein
the sub-pixels include a first sub-pixel, a second sub-pixel, and a third sub-pixel,
the first sub-pixel, the second sub-pixel, the third sub-pixel, the first sub-pixel, the second sub-pixel, and the third sub-pixel are repeatedly arrayed in order in the first direction, and
in two of the first sub-pixels sandwiching the second sub-pixel and the third sub-pixel, the first pixel circuit and the second pixel circuit of one first sub-pixel and the first pixel circuit and the second pixel circuit of the other first sub-pixel are disposed in line symmetry with respect to an axis of symmetry parallel to the second direction intersecting the first direction.

* * * * *